United States Patent [19]

Ohlstein et al.

[11] 3,870,974

[45] Mar. 11, 1975

[54] MIC CARRIER GROUNDING ARRANGEMENT

[75] Inventors: Herbert Ohlstein, Elmwood Park; Alan H. Gruber, Cedar Grove, both of N.J.

[73] Assignee: International Telephone and Telegraph Corporation, Nutley, N.J.

[22] Filed: Sept. 18, 1973

[21] Appl. No.: 398,354

[52] U.S. Cl. ............. 333/12, 174/35 GC, 333/99 R
[51] Int. Cl. ............. H04b 15/02
[58] Field of Search ........ 317/101 A; 333/12, 84 M, 333/99; 174/35 GC

[56] References Cited

UNITED STATES PATENTS

| | | | |
|---|---|---|---|
| 3,594,490 | 7/1971 | Mitchell et al. | 174/35 GC X |
| 3,752,899 | 8/1973 | Bakker | 174/35 GC |

*Primary Examiner*—Paul L. Gensler
*Attorney, Agent, or Firm*—John T. O'Halloran; Menotti J. Lombardi, Jr.; Alfred C. Hill

[57] ABSTRACT

The gaps between adjacent MIC carriers or an MIC carrier and the sidewall of a chassis into which the carriers are inserted introduce a series reactance at frequencies at C band and above which causes deterioration of the operation of the equipment containing the MIC carriers. In accordance with the present invention these gaps between adjacent carriers and/or a carrier and the sidewall of a chassis into which the carriers are inserted are effectively short-circuited by providing a groove in and completely around the outer surface of the carrier and inserting therein a flexible conductive gasket so that when the carriers are inserted in the chassis the gaskets between adjacent carriers and/or between a carrier and the chassis sidewall are in contact under compression.

8 Claims, 2 Drawing Figures

MIC CARRIER GROUNDING ARRANGEMENT

BACKGROUND OF THE INVENTION

This invention relates to microwave integrated circuit (MIC) assemblies and, more particularly, to ground arrangements for the carriers for such MIC assemblies.

At frequencies in C band (3.9–6.2 gigahertz) and above, the gap between adjacent MIC carriers and/or an MIC carrier and the sidewall of a chassis into which the carriers are inserted represents a significant portion of a wavelength. This gap manifests itself as a series reactance (inductance). This series reactance may cause unwanted resonances, bandwidth restriction, loss of gain and loss of power output from the equipment containing the MIC carriers. In addition, poor input and output standing wave ratios are experienced when launching into or out of an MIC chassis.

At present the gap problem is being solved in two ways: (1) a thin brass or soft copper shim is inserted between adjacent carriers and/or a carrier and the sidewall of the chassis and all gaps are closed as tight as possible; and (2) conductive epoxy paste is poured into the gaps.

The above two methods are satisfactory for breadboard chassis, but are not suitable for various obvious reasons for mass production techniques.

A third obvious solution to this gap problem would be to tighten all tolerances of the carriers and the chassis to insure a nearly press-fit for all MIC components. This, however, is prohibitively expensive.

SUMMARY OF THE INVENTION

An object of the present invention is to provide a grounding arrangement for an MIC carrier which will overcome the gap problem and will not have the disadvantages of the three above-mentioned previously employed solutions.

A feature of the present invention is the provision of a grounding arrangement for a microwave integrated circuit carrier comprising: a groove formed in and completely around the outer surface of the carrier; and a flexible conductive gasket disposed in the groove, the gasket providing a first ground connection between at least adjacent spaced microwave integrated circuit carriers when the carriers are inserted in a chassis containing the carriers in an operative relationship.

BRIEF DESCRIPTION OF THE DRAWING

The above-mentioned and other features and objects of this invention will become more apparent by reference to the following description taken in conjunction with the accompanying drawing, in which.

DESCRIPTION OF THE PREFERRED EMBODIMENT

Figure 2:
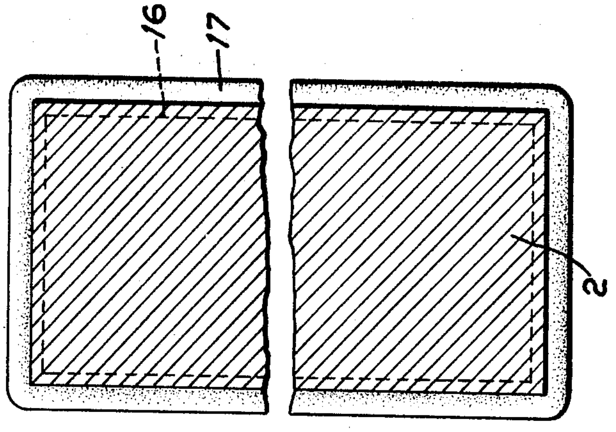
FIG. 2 is a cross-section taken along line 2—2 of FIG. 1.
Figure 1:
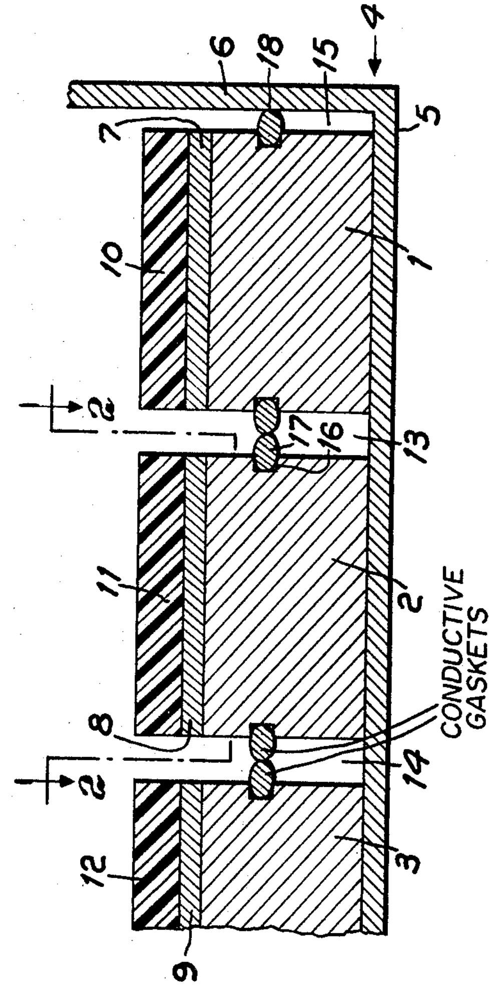
FIG. 1 is a cross-sectional view of a plurality of MIC carriers inserted into a chassis incorporating the grounding arrangment in accordance with the principles of the present invention.

Referring to FIGS. 1 and 2, MIC carriers 1, 2 and 3 together with other carriers are inserted in a chassis 4 including a bottom wall 5 and a sidewall 6. Each of the carriers 1, 2 and 3 carry a layer of conductive epoxy 7, 8 and 9, respectively, upon which is supported the substrate 10, 11 and 12, respectively. The upper surface of substrates 10, 11 and 12 have disposed thereon the microwave circuitry (not shown) employing any of the well known techniques for forming MIC components on the surface of the substrates 10, 11 and 12.

The gap 13 between carriers 1 and 2, the gap 14 between carriers 2 and 3, and the gap 15 between carrier 1 and chassis sidewall 6 are the gaps that provide a series reactance at C band frequencies or above and provide undesired equipment operating characteristics as outlined hereinabove in the section entitled "Background of the Invention."

In accordance with the principles of the present invention a groove 16 is formed in and completely around the outer surface of each of carriers 1, 2 and 3. In one reduction to practice of the grounding arrangement technique described herein, this groove was an 0.060 by 0.060 groove and was disposed approximately 0.050 below the bottom of the substrate. In grooves 16 formed in each of the carriers 1, 2 and 3 is disposed a conductive gasket 17, such as a conductive rubber gasket, in the form of an O or D ring.

When carriers 1, 2 and 3 are inserted in chassis 4 the carriers are connected together by gaskets 17 which are placed under compression and in contact with one another or the adjacent chassis sidewall 6, as shown at point 18.

With this arrangement the gaskets 17 carried by each of the carriers 1, 2 and 3 effectively short-circuit the gaps 13, 14 and 15 and thereby remove the series reactance due to the frequency band involved. Thus, unwanted resonances are eliminated and bandwidth gain, power output and input and output standing wave ratios are improved.

While we have described above the principles of our invention in connection with specific apparatus, it is to be clearly understood that this description is only made by way of example and not as a limitation to the scope of our invention as set forth in the objects thereof and in the accompanying claims.

We claim:

1. A grounding arrangement for a plurality of microwave integrated circuit carriers comprising:

a chassis having a bottom wall and at least one side wall extending from and perpendicular to said bottom wall;

said plurality of carriers being disposed in said chassis on said bottom wall in an operative relationship, at least adjacent ones of said plurality of carriers having first gaps therebetween perpendicular to said bottom wall;

a groove formed in and completely around the outer surface of each of said plurality of carriers at a given distance above said bottom wall;

a flexible conductive gasket disposed in each of said grooves, said gaskets of said adjacent ones of said plurality of carriers being disposed in contact with each other under compression to ground said first gaps.

2. An arrangement according to claim 1, wherein each of said gaskets includes
a conductive rubber gasket.

3. An arrangement according to claim 2, wherein each of said conductive rubber gaskets is in the form of an O ring.

4. An arrangement according to claim 2, wherein each of said conductive rubber gaskets is in the form of a D ring.

5. An arrangement according to claim 1, further including at least a second gap between said side wall and one of said plurality of carriers in juxtaposition with said side wall; and wherein said gasket of said one of said plurality of carriers engages said side wall under compression to ground said second gap.

6. An arrangement according to claim 5, wherein said gasket includes a conductive rubber gasket.

7. An arrangement according to claim 6, wherein said conductive rubber gasket is in the form of an O ring.

8. An arrangement according to claim 6, wherein said conductive rubber gasket is in the form of a D ring.

* * * * *